(12) United States Patent
Maejima

(10) Patent No.: US 8,045,362 B2
(45) Date of Patent: Oct. 25, 2011

(54) SEMICONDUCTOR MEMORY DEVICE

(75) Inventor: Hiroshi Maejima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 260 days.

(21) Appl. No.: 12/510,629

(22) Filed: Jul. 28, 2009

(65) Prior Publication Data

US 2010/0027317 A1    Feb. 4, 2010

(30) Foreign Application Priority Data

Jul. 30, 2008    (JP) .................................. 2008-196367

(51) Int. Cl.
  *G11C 11/00*    (2006.01)
(52) U.S. Cl. ............... 365/148; 365/189.06; 365/189.14; 365/63
(58) Field of Classification Search .................. 365/148, 365/189.06, 189.14, 51, 63, 163
See application file for complete search history.

(56) References Cited

U.S. PATENT DOCUMENTS

| | | | |
|---|---|---|---|
| 7,778,062 B2 * | 8/2010 | Toda et al. ..................... | 365/148 |
| 2003/0067013 A1 * | 4/2003 | Ichihara et al. ............... | 257/200 |
| 2008/0291716 A1 * | 11/2008 | Futatsuyama et al. ........ | 365/148 |
| 2009/0207647 A1 | 8/2009 | Maejima et al. | |
| 2010/0214820 A1 | 8/2010 | Hosono et al. | |

\* cited by examiner

*Primary Examiner* — Tuan Nguyen
*Assistant Examiner* — Toan Le
(74) *Attorney, Agent, or Firm* — Oblon, Spivak, McClelland, Maier & Neustadt, L.L.P.

(57) ABSTRACT

A semiconductor memory device comprising: a memory cell array in which memory cells each containing a variable resistive element and a rectifier element connected in series are arranged at intersections of a plurality of first wirings and a plurality of second wirings; and a control circuit for selectively driving said first wirings and said second wirings; wherein said control circuit applies a first voltage to said selected first wiring, and changes said first voltage based on the position of said selected memory cell within said memory cell array to apply a second voltage to said selected second wiring, so that a predetermined potential difference is applied to a selected memory cell arranged at the intersection between said selected first wiring and said selected second wiring.

11 Claims, 11 Drawing Sheets

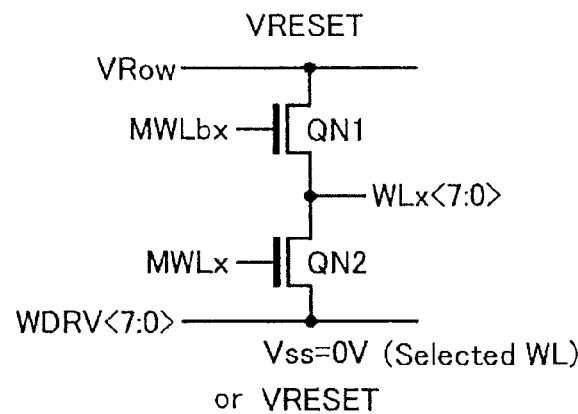
Fig. 6    Row decoder 10
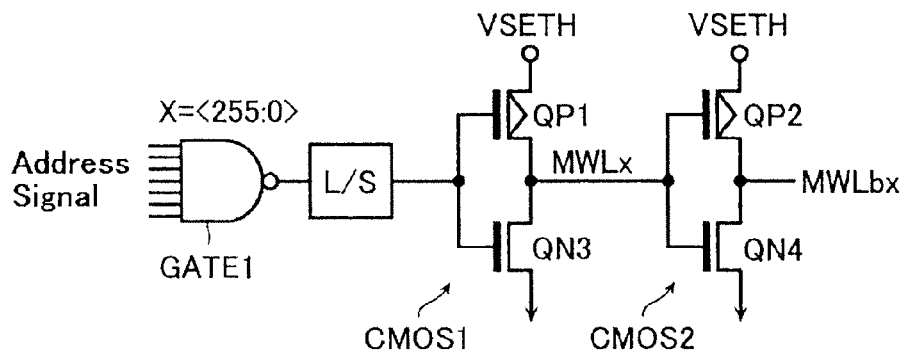
Fig. 7    Main Row decoder 11
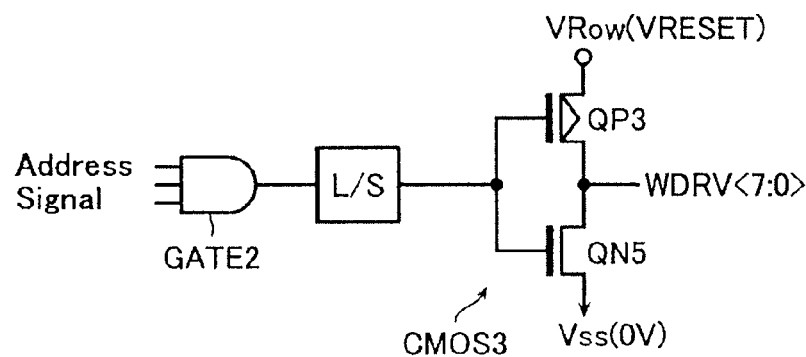
Fig. 8    WDRV Driver 12

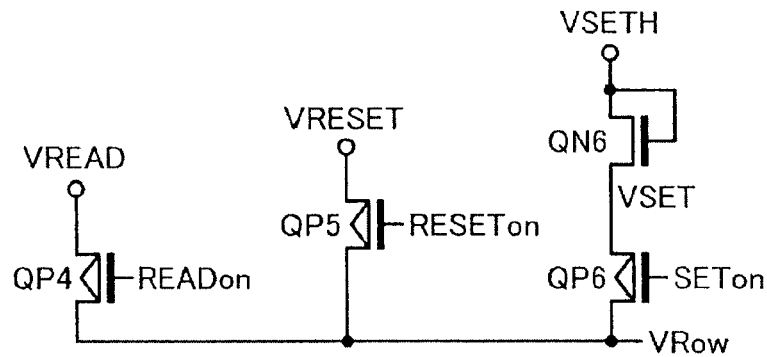
Fig. 9    VRow Driver 13
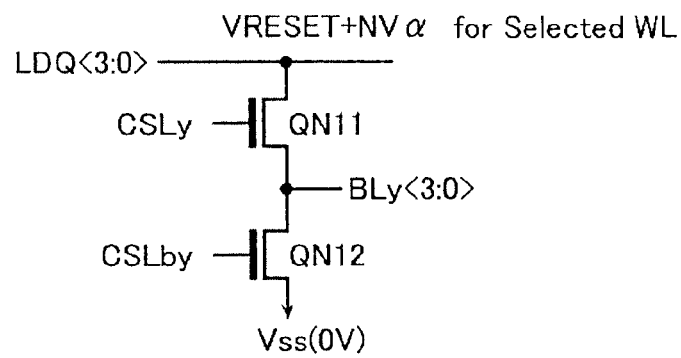
Fig. 10    Column Switch 20
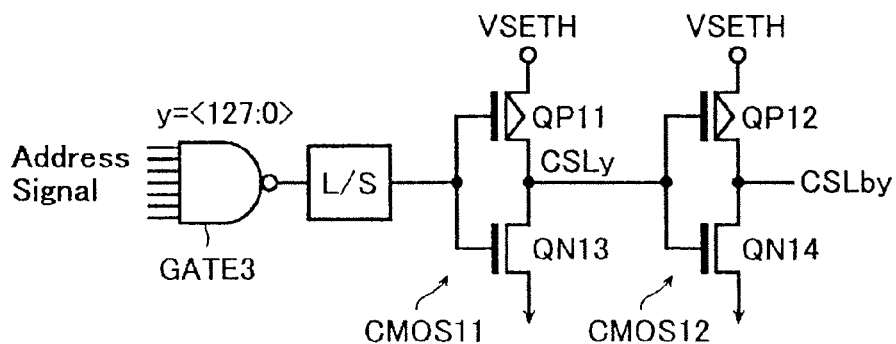
Fig. 11    Column decoder 21

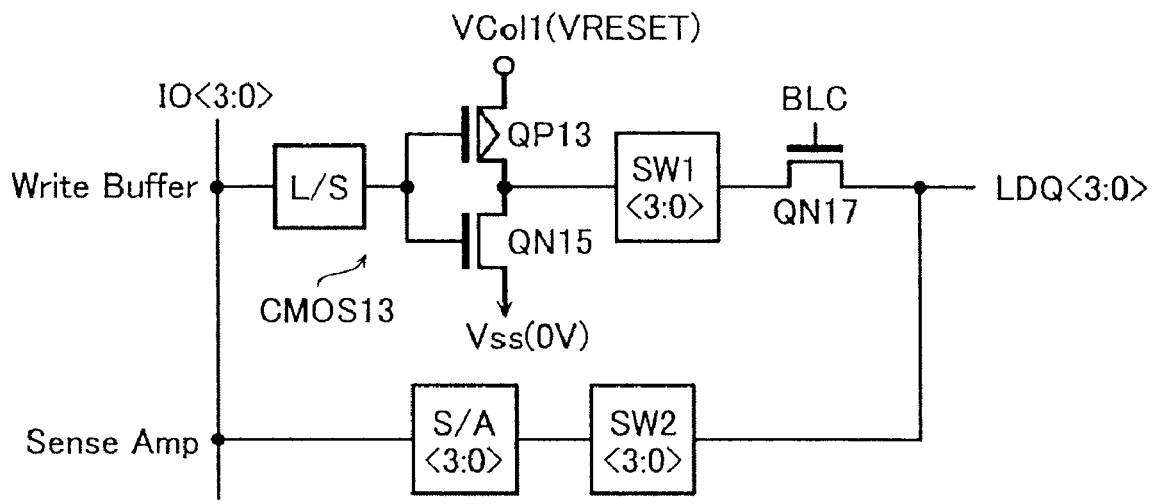
Fig.12   Sense Amp & Write Buffer 22
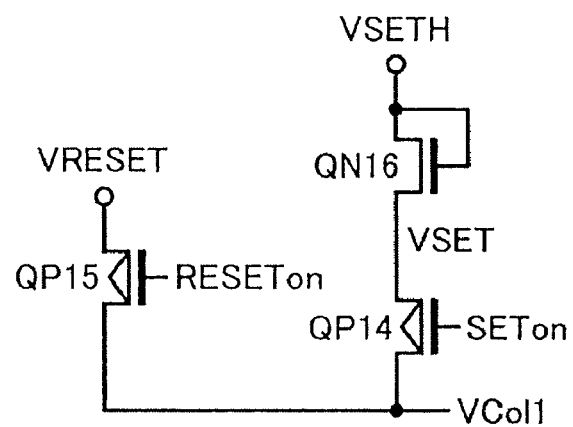
Fig. 13   VCol Driver 23

SEMICONDUCTOR MEMORY DEVICE

CROSS-REFERENCE TO RELATED APPLICATION

This application is based upon and claims the benefit of priority from the prior Japanese Patent Application No. 2008-196367, filed on Jul. 30, 2008, the entire contents of which are incorporated herein by reference.

BACKGROUND OF THE INVENTION

1. Field of the Invention

The present invention relates to a nonvolatile semiconductor memory device for nonvolatilely writing data in accordance with application of a voltage to a variable resistive element.

2. Description of the Related Art

In recent years, attention has been focused on a variable resistive memory as a succeeding candidate of a flash memory. Herein, the variable resistive memory devices include a variable resistive memory (ReRAM: Resistive RAM) in a narrow sense that nonvolatilely stores the resistance value state of a transition metal oxide element as the recording layer, and a phase change memory (PCRAM: Phase Change RAM) that utilizes the resistance value information in a crystalline state (conductor) and an amorphous state (insulator) using a chalcogenide element as the recording layer.

It is well known that the variable resistive elements of the variable resistive memory have two kinds of operation modes. One of the modes is called a bipolar type of setting a high-resistance state and a low-resistance state by switching the polarity of applied voltage. The other is called a unipolar type of setting the high-resistance state and the low-resistance state by controlling the voltage value and the voltage application time without switching the polarity of applied voltage. To realize a high density memory cell array, the unipolar type is preferred. In the case of the unipolar type, a cell array can be configured by disposing a variable resistive element and a rectifier element such as a diode at each intersection of word lines and bit lines without using a transistor. Further, a large capacity of memory can be realized by laminating and arranging such memory cell array in three dimensions without increasing the cell array area (refer to JP-A-2005-522045).

In performing a set operation of writing data, a reset operation of erasing data and a read operation of reading data in the memory cell array provided on a semiconductor substrate, a certain processing time is required. Particularly, the reset operation has a longer voltage application time required and takes a longer time for processing than the set operation. To increase the speed of the processing of the variable resistive memory device in the reset operation, it is required to increase the number of memory cells to make the reset operation in parallel within the memory cell array. However, as the number of memory cells to make the reset operation is greater, a voltage drop due to a parasitic resistance of the wiring within the memory cell array increases. Due to this voltage drop, it is not possible to apply sufficient voltage and current to the memory cells, whereby there is a risk that the reset operation is not performed for the desired memory cell.

BRIEF DESCRIPTION OF THE SEVERAL VIEWS OF THE DRAWINGS

FIG. 6 is a circuit diagram showing an arrangement example of a row control circuit for the variable resistive memory device according to the first embodiment.

FIG. 7 is a circuit diagram showing an arrangement example of a row control circuit for the variable resistive memory device according to the first embodiment.

FIG. 8 is a circuit diagram showing an arrangement example of a row control circuit for the variable resistive memory device according to the first embodiment.

FIG. 9 is a circuit diagram showing an arrangement example of a row control circuit for the variable resistive memory device according to the first embodiment.

FIG. 10 is a circuit diagram showing an arrangement example of a column control circuit for the variable resistive memory device according to the first embodiment.

FIG. 11 is a circuit diagram showing an arrangement example of a column control circuit for the variable resistive memory device according to the first embodiment.

FIG. 12 is a circuit diagram showing an arrangement example of a column control circuit for the variable resistive memory device according to the first embodiment.

FIG. 13 is a circuit diagram showing an arrangement example of a column control circuit for the variable resistive memory device according to the first embodiment.

DETAILED DESCRIPTION OF THE INVENTION

First Embodiment

A first embodiment of the invention will now be described with reference to the drawings.

[Entire Configuration]

A semiconductor memory device according to this embodiment will be described as a variable resistive memory device having a three dimensional memory cell array structure in which the memory cell arrays are laminated. However, it is needless to say that this constitution is only illustrative, and the invention is not limited to this.

Figure 1:
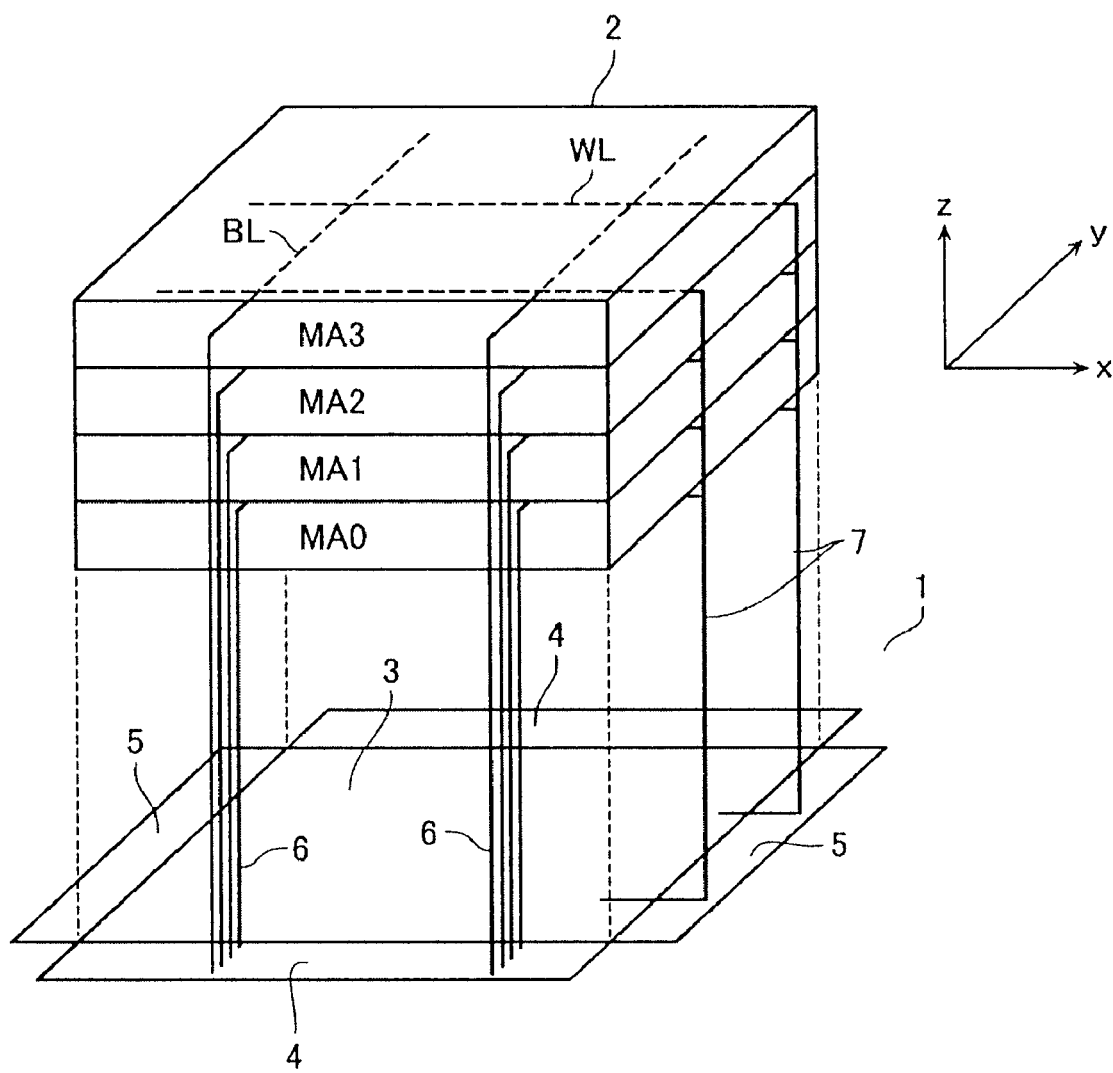
FIG. 1 is a perspective view showing the configuration of a variable resistive memory device according to a first embodiment.

FIG. 1 shows a basic constitution of the variable resistive memory device according to the embodiment of the invention, namely, the constitution of a wiring area 3 where a wiring such as a global bus is formed on a semiconductor substrate 1 and a memory block 2 laminated thereon.

The memory block 2 is composed of four layers of memory cell arrays MA0 to MA3 in this example, as shown in FIG. 1. The wiring area 3 is provided on the semiconductor substrate 1 directly beneath the memory block 2. The wiring area 3 is provided with a global bus or the like for exchanging data written/read into/from the memory block 2 with external. Also, this wiring area 3 may be provided with a column control circuit including a column switch or a row control circuit including a row decoder as will be described later.

To connect the word line WL and the bit line BL of each of the laminated memory cell arrays MA with the wiring area 3 formed on the semiconductor substrate 1, a vertical wiring (via contact) is required on the side face of the memory block 2. A bit line contact area 4 and a word line contact area 5 are provided on four sides of the wiring area 3. A bit line contact 6 and a word line contact 7 for connecting the bit line BL and the word line WL with the control circuit are formed in the bit line contact area 4 and the word line contact area 5. The word line WL has one end connected via the word line contact 7 formed in the word line contact area 5 to the wiring area 3. Also, the bit line BL has one end connected via the bit line contact 6 formed in the bit line contact area 4 to the wiring area 3.

Though one memory block 2 in which a plurality of memory cell arrays MA are laminated in the vertical direction (z direction as indicated in FIG. 1) to the semiconductor substrate 1 is shown in FIG. 1, a plurality of such unit memory blocks 2 are actually arranged in matrix in the longitudinal direction (x direction as indicated in FIG. 1) of the word line WL and the longitudinal direction (y direction as indicated in FIG. 1) of the bit line BL.

In the word line contact area 5 of this embodiment, the word lines WL of all the layers in one cross-section are connected via only one row of contacts, or via a common contact to the wiring area 3, as shown in FIG. 1. Also, in the bit line contact area 4, the bit line BL of each layer is connected via one of four rows of contacts prepared separately to the wiring area 3. Though the bit lines BL are independently driven for each layer and the word lines WL on all the layers are connected commonly in this embodiment, the word lines WL may be independently driven for each layer. Also, the bit lines BL may be common and the word lines WL may be independently driven. Further, at least one of the bit lines BL and the word lines WL may be shared between the upper and lower layers.

Figure 2:
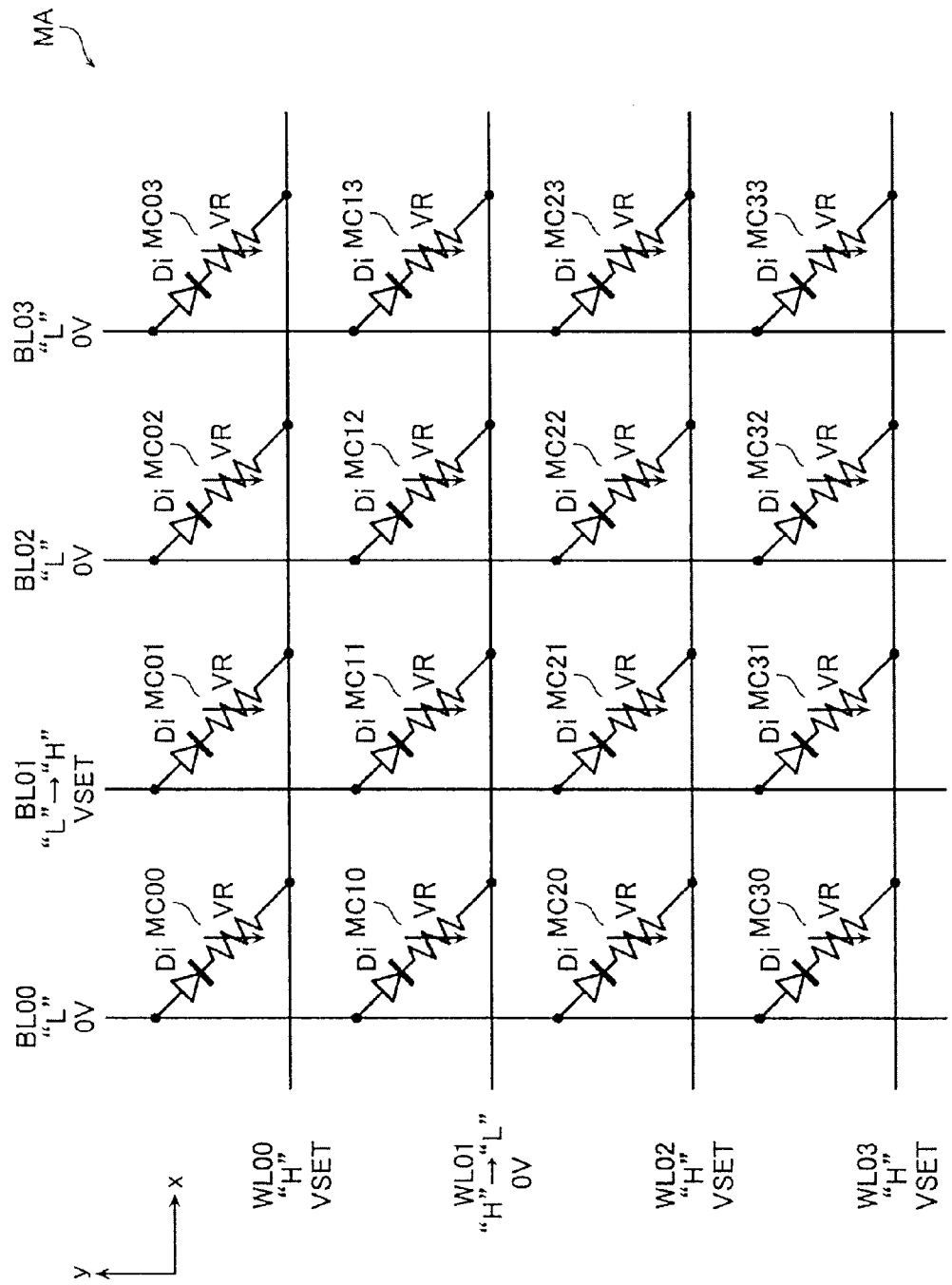
FIG. 2 is a circuit diagram showing an equivalent circuit of a memory cell array in the variable resistive memory device according to the first embodiment.

FIG. 2 is a circuit diagram showing an equivalent circuit of the memory cell array MA in the variable resistive memory device. Herein, the memory cell array MA as shown in FIG. 2 is composed of unit memory cells MC, each of which is 2 Kbit (2048 cells) in the longitudinal direction (y direction as indicated in FIG. 2) of the bit lines BL and 512 bit in the longitudinal direction (x direction as indicated in FIG. 2) of the word lines WL. Thereby, the unit memory cells MC of 1 Mbit (about $10^6$ cells) are arranged within one memory cell array MA. Within one memory cell array MA, the unit memory cells MC are arranged in two-dimensional matrix. A unit memory cell MC of resistance variation type in which a rectifier element, for example, a diode Di and a variable resistive element VR are connected in series is disposed at each intersection between the word lines WL and the bit lines BL. Herein, the arrangement and polarity of the diode Di and the variable resistive element VR making up the memory cell MC are not limited to those as shown in the figure.

The variable resistive element VR has a structure composed of electrode/transition metal oxide/electrode, for example, and causes a resistance change of metal oxide depending on the application conditions of voltage, current and heat and nonvolatilely stores a different state of the resistance value as information. Available examples of the variable resistive element VR specifically include: one that changes the resistance in accordance with a phase change between the crystalline state and the amorphous state, such as a chalcogenide (PCRAM), one that changes the resistance by precipitating metal cations to form a bridge (contacting bridge) between electrodes and ionizing the precipitated metal to destruct the bridge (CBRAM: Conductive Bridging RAM), and one that changes the resistance by applying a voltage or current (ReRAM) (which is roughly divided into one that causes a variation in resistance in accordance with the presence/absence of charge trapped in charge traps present in the electrode interface, and one that causes a variation in resistance in accordance with the presence/absence of the conduction path due to an oxygen loss and so forth).

In the case of the ReRAM of the unipolar type, writing data into the memory cell MC is made by applying a voltage of e.g. 3.5V (actually about 4.5V including a voltage drop of the diode Di) to the variable resistive element VR and a current of about 10 nA for about 10 ns to 100 ns. Thereby, the variable resistive element VR changes from the high-resistance state to the low-resistance state. In the following, an operation of changing this variable resistive element VR from the high-resistance state to the low-resistance state is called a set operation.

On the other hand, erasing data from the memory cell MC is made by applying a voltage of 0.8V (actually about 1.8V including a voltage drop of the diode Di) to the variable resistive element VR in the low-resistance state after the set operation and a current of about 1 μA to 10 μA for about 500 ns to 2 μs. Thereby, the variable resistive element VR changes from the low-resistance state to the high-resistance state. In the following, an operation of changing this variable resistive element VR from the low-resistance state to the high-resistance state is called a reset operation.

The memory cell MC has the high-resistance state as the stable state (reset state), for example, in which in binary data storage, data is written through the set operation of changing the reset state to the low-resistance state.

A read operation of the memory cell MC involves applying a voltage of 0.4V (actually about 1.4V including a voltage drop of the diode Di) to the variable resistive element VR and monitoring a current flowing via the variable resistive element VR. Thereby, it is determined whether the variable resistive element VR is in the low-resistance state or the high-resistance state.

Referring to FIG. 2, the set operation of the variable resistive memory device according to this embodiment will be described below. In FIG. 2, a state of the voltages applied to the bit lines BL and the word lines WL connected to the memory cell array MA during the set operation for the memory cell MC is shown. Herein, it is supposed in the following explanation that the selected memory cell MC into which data is written through the set operation is MC11.

The unselected bit lines BL00, BL02, BL03 unconnected to the selected memory cell MC11 are in an "L" state (Vss=0V in this embodiment). The selected bit line BL01 connected to the selected memory cell MC11 is driven from the "L" state (Vss=0V) to an "H" state (voltage VSET in this embodiment) during the set operation. Also, the unselected word lines WL00, WL02, WL03 unconnected to the selected memory cell MC11 are in the "H" state (voltage VSET in this embodiment). The selected word line WL01 connected to the selected memory cell MC11 is driven from the "H" state (voltage VSET) to the "L" state (voltage Vss=0V in this embodiment) during the set operation. Thereby, the diode Di of the selected memory cell MC11 takes a forward bias state to make a current flow. A potential difference VSET is applied to the selected memory cell MC11, so that the variable resistive element VR changes from the high-resistance state to the low-resistance state, thereby completing the set operation.

Figure 3:
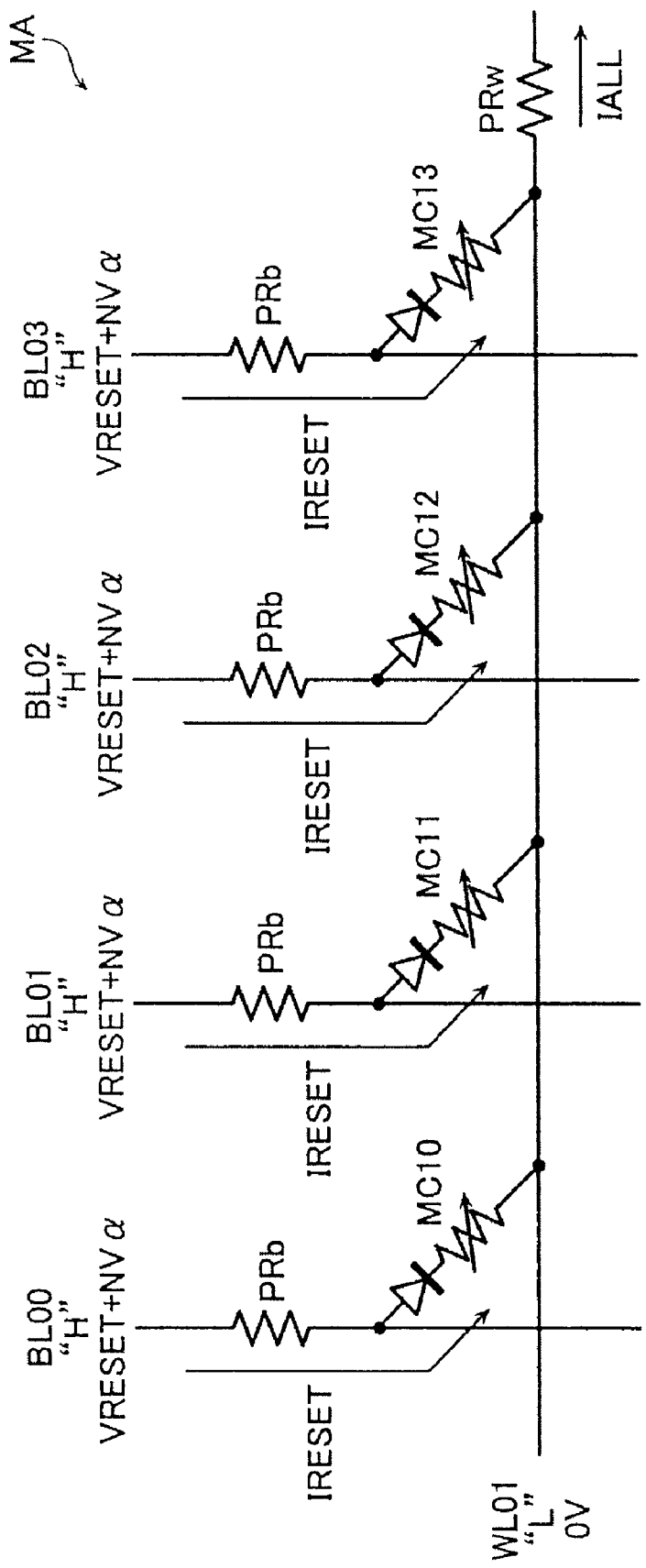
FIG. 3 is a circuit diagram showing an equivalent circuit of a memory cell array in the variable resistive memory device according to the first embodiment.

Referring now to FIG. 3, the reset operation of the variable resistive memory device according to this embodiment will be described below. FIG. 3 is a circuit diagram showing an equivalent circuit of the memory cell array MA in the variable resistive memory device. In FIG. 3, the same reference signs are attached to the components having the same configuration as in FIG. 2, the explanation of which is omitted. Though the memory cell array MA of FIG. 3 has the same configuration as the memory cell array MA of FIG. 2, the configuration of the word lines WL00, WL02, WL03 is omitted in FIG. 3.

In FIG. 3, a state of voltage and current applied to the bit lines BL and the word line WL connected to the memory cell array MA during the reset operation of the memory cell MC is shown. Herein, it is supposed in the following explanation that the selected memory cells from which data is erased in parallel (simultaneously) by the reset operation are four memory cells MC10 to MC14.

The selected bit lines BL00 to BL03 connected to the selected memory cells MC10 to MC13 are driven into the "H" state (voltage VRESET+N*Vα in this embodiment) during the reset operation. Also, the selected word line WL01 connected to the selected memory cells MC10 to MC13 is driven into the "L" state (voltage Vss=0V in this embodiment) during the reset operation. And the unselected word lines WL00, WL02, WL03 unconnected to the selected memory cells MC10 to MC13 are in the "H" state (e.g., voltage VRESET), though not shown in FIG. 3.

By application of voltage to the selected bit lines BL00 to BL03, the diodes Di of the selected memory cells MC10 to MC13 take the forward bias state to make a current flow. A reset current IRESET capable of performing the reset operation flows through each memory cell MC. The current IALL flowing through the word line WL01 is the total amount of reset current IRESET flowing through N (four in this embodiment) memory cells MC for which the reset operation is performed, and therefore is N*IRESET.

Herein, the voltage VRESET among the reset voltage VRESET+N*Vα applied to the bit lines BL00 to BL03 is a reference voltage capable of changing the variable resistive element VR of the memory cell MC from the low-resistance state to the high-resistance state. Also, the voltage N*Vα is the voltage corresponding to a voltage drop due to parasitive resistances PRb and PRw in the bit line BL and the word line WL. N represents the number of selected memory cells MC for which the reset operation is performed in parallel, and N=4 in this embodiment. Vα is the voltage drop per memory cell MC, and decided by the parasitive resistances PRb and PRw in the bit line BL and the word line WL.

The reset voltage VRESET+N*Vα applied to the bit lines BL00 to BL03 drops by the amount of voltage N*Vα due to the parasitive resistances PRb and PRw in the bit line BL and the word line WL, so that the potential difference VRESET is applied to the selected memory cells MC10 to MC13. Owing to this potential difference VRESET, the variable resistive element VR changes from the low-resistance state to the high-resistance state, thereby completing the reset operation.

Herein, the value of parasitic resistances PRb and PRw in the bit line BL and the word line WL changes depending on the position of the memory cell MC within the memory cell array MA. Therefore, the value of Vα may be set differently, based on the position of each memory cell MC within the memory cell array MA. In this embodiment, the value of the reset voltage applied to the selected bit lines BL00 to BL03 is the voltage VRESET+N*Vα. This means that the value of the reset voltage applied to the other bit lines BLy0 to BLy3 can be set at VRESET+N*Vα' in performing the reset operation for the other memory cells MC.

Figure 4:
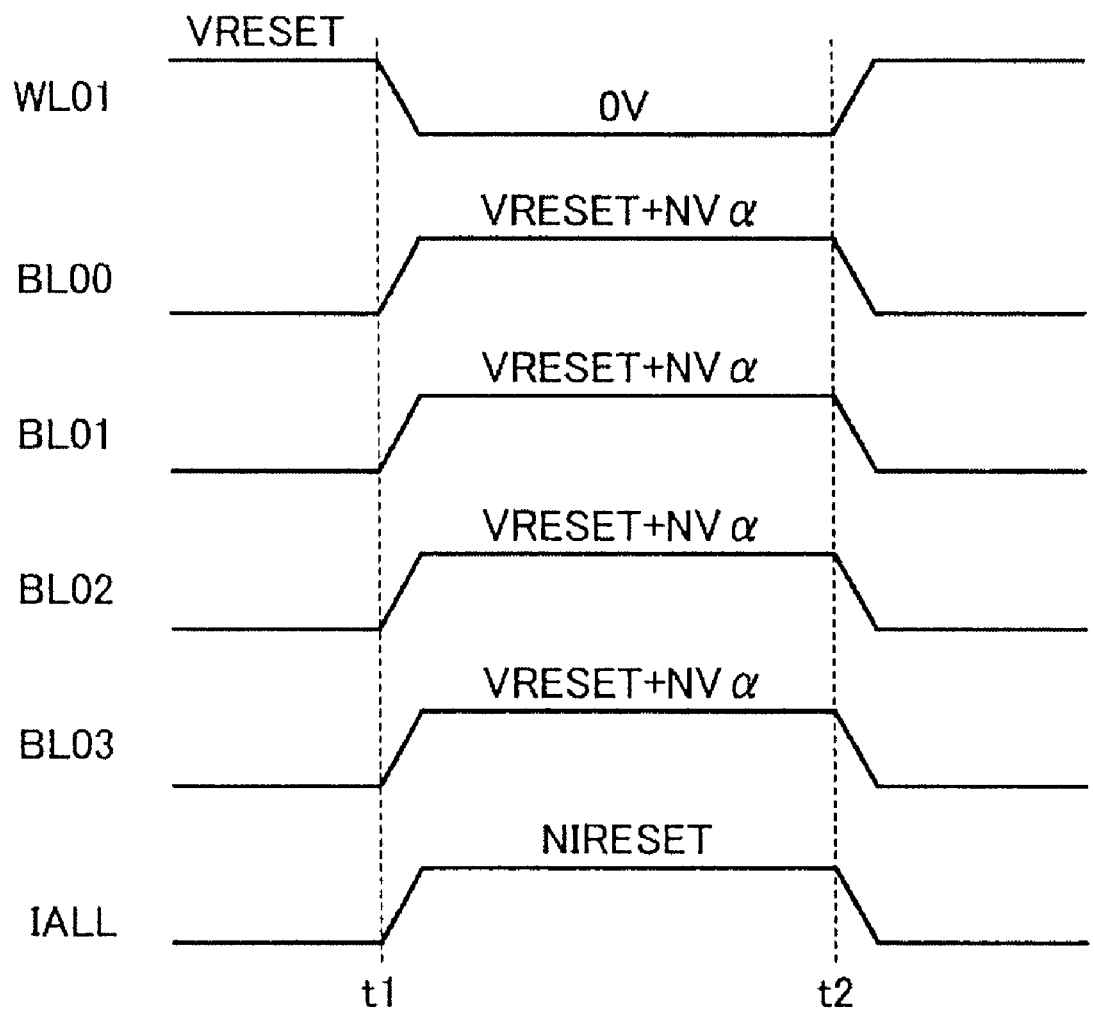
FIG. 4 is a view showing the change of voltage and current applied to the bit lines and the word line of the variable resistive memory device according to the first embodiment.

Referring to FIG. 4, the timing of the reset operation for the memory cell MC in the variable resistive memory device according to this embodiment will be described below. FIG. 4 is a view showing the temporal changes in voltage and current applied to the bit line BL and the word line WL connected to the memory cell array MA during the reset operation of the memory cell MC. In FIG. 4, the word line WL01 and the bit lines BL00 to BL03 indicate the voltage values applied to the word line WL01 and the bit lines BL00 to BL03, and current IALL indicates the total amount of current flowing through the word line WL01 as shown in FIG. 3.

In performing the reset operation for the selected memory cell MC, first of all, the voltage applied to the selected word line WL01 is changed from the voltage VRESET to the voltage Vss=0V (time t1), as shown in FIG. 4. At the same time, the reset voltage VRESET+N*Vα is applied to the selected bit lines BL00 to BL03 connected to the selected memory cell MC. At the time t1, the current IALL flowing though the word line WL01 is the current amount (N*IRESET) that is the reset current IRESET per memory cell MC multiplied by the number of selected memory cells MC (N=4 in this embodiment) for which the reset operation is performed.

Thereby, the diodes Di of the selected memory cells MC10 to MC13 take the forward bias state to make a current flow. Herein, the reset voltage N*Vα among the reset voltage VRESET+N*Vα applied to the bit lines BL00 to BL03 is the voltage corresponding to a voltage drop due to parasitic resistances PRb and PRw of the wirings in the bit line BL and the word line WL. Because of the voltage drop by the voltage N*Vα due to the parasitic resistances of the wirings, the potential difference VRESET is applied to the selected memory cells MC10 to MC13. Owing to this potential difference VRESET, the variable resistive element VR changes from the high-resistance state to the low-resistance state.

After the passage of the application time of current and voltage required for the reset operation, the voltage VRESET is applied to the word line WL01 (time t2). At the same time, the voltage applied to the bit lines BL00 to BL03 is changed from the voltage VRESET+N*Vα to the voltage Vss=0V. At this time t2, the reset operation is ended, so that the current IALL flowing through the word line WL01 becomes 0.

In this embodiment, the voltage N*Vα of the voltage drop due to the parasitic resistances of the wirings in addition to the voltage VRESET capable of performing the reset operation for the memory cell MC is applied to the selected bit lines BL00 to BL03 connected to the selected memory cells MC10 to MC13. This voltage Vα takes a different value with the position of the memory cell MC within the memory cell array MA. Also, N is the number of selected memory cells MC for which the reset operation is performed. The reset voltage applied to each bit line BL is changed based on the address of the memory cell MC and the number of cells for which the reset operation is performed. After the voltage drop due to the wiring resistance of the bit line BL and the word line WL, the voltage applied to the memory cell MC for which the reset voltage is performed is the constant reset voltage VRESET. Therefore, even if the voltage drop occurs due to the wiring resistance, the voltage VRESET sufficient to perform the reset operation for the memory cell MC is applied. The variable resistive memory device according to this embodiment can securely perform the reset operation for a number of memory cells.

[Configuration of Control Circuit]

Figure 5:
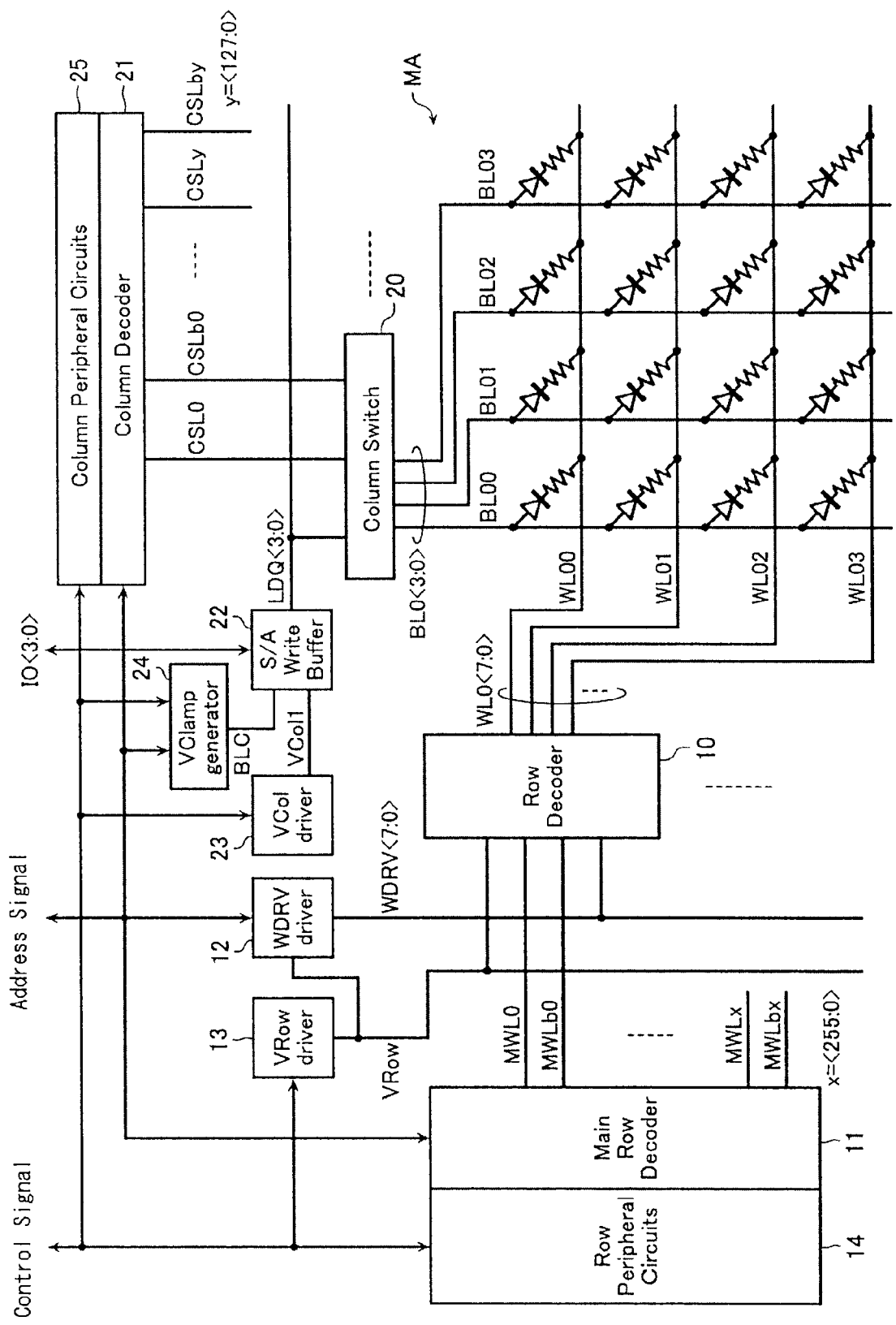
FIG. 5 is a block diagram showing an arrangement example of a column/row control circuit for the variable resistive memory device according to the first embodiment.

Referring now to FIGS. 5 to 14, the circuit configuration of the variable resistive memory device in which the reset voltage VRESET+N*Vα is applied to the bit lines BL00 to BL03 during the reset operation will be described below. Herein, a memory cell array MA of 1 Mbit is configured by arranging the memory cells of 2 Kbit (2048 bit) in the word line direction and 512 bit in the bit line direction. FIG. 5 is a block diagram showing an arrangement example of a column control circuit and a row control circuit in the variable resistive memory device.

The row control circuit includes a row decoder 10, a main row decoder 11, a write drive line driver 12, a row power line driver 13 and a row peripheral circuit 14, as shown in FIG. 5. Also, the column control circuit includes a column switch 20, a column decoder 21, a sense amplifier/write buffer 22, a column power line driver 23, a clamp voltage generation circuit 24 and a column peripheral circuit 25.

The word lines WL according to this embodiment have a hierarchical structure, in which the main row decoder 11 selectively drives any one of 256 pairs of main word lines MWLx and MWLbx (x=<255:0>). As one example, in the selected main word lines MWLx and MWLbx, the main word line MWLx is in the "H" state and the main word line MWLbx is in the "L" state. Conversely, in the unselected main word lines MWLx and MWLbx, the main word line MWLx is in the "L" state and the main word line MWLbx is in the "H" state. One pair of main word lines MWLx and MWLbx are connected to one row decoder 10. The row decoder 10 selectively drives one word line from a word line group WLx<7:0> composed of eight word lines WL under the hierarchy of the main word lines MWLx and MWLbx. The row decoder 10 connected to the main word lines MWLx and MWLbx selectively driven by the main row decoder 11 further selectively drives the word lines WL, so that one word line WL is selectively driven.

The write drive line driver 12 is connected to the eight write drive lines WDRV<7:0> and the row power line VRow, and the row power line driver 13 is connected to the row power line VRow. The row decoder 10 is connected to the write drive lines WDRV<7:0> and the row power line VRow. A voltage for the row decoder 10 to drive the word line WL is applied to the write drive lines WDRV<7:0> and the row power line VRow. More specifically, a voltage Vss (=0V) is supplied to one write drive line WDRV of the eight write drive lines WDRV<7:0> corresponding to the selected word line WL and a voltage VRESET is supplied to the other seven drive lines during the reset operation. Also, the voltage (VRESET) supplied to the word line WL under the hierarchy of the unselected main word lines MWL and MWLbx is applied to the row power line VRow.

The row peripheral circuit 14 manages the entire variable resistive memory device to receive a control signal from an external host device, read, write, erase and execute data input/output management.

The bit lines BL according to this embodiment also have a hierarchical structure, in which the column decoder 21 selectively drives any one of 128 pairs of column selection lines CSLy and CSLby (y=<127:0>). As one example, in the selected column selection lines CSLy and CSLby, the column selection line CSLy is in the "H" state and the column selection line CSLby is in the "L" state. Conversely, in the unselected column selection lines CSLy and CSLby, the column selection line CSLy is in the "L" state and the column selection line CSLby is in the "H" state. One pair of column selection lines CSLy and CSLby is connected to one column switch 20. The column switch 20 selectively drives one bit line from a bit line group BLy<3:0> composed of four bit lines BL under the hierarchy of the column selection lines CSLy and CSLby. The column switch 20 connected to the column selection lines CSLy and CSLby selectively driven by the column decoder 21 further selectively drives the bit lines BL, so that one bit line BL is selectively driven.

The sense amplifier/write buffer 22 is connected to the four local data lines LDQ<3:0>. The local data lines LDQ<3:0> are connected to the column switch 20. The sense amplifier/write buffer 22 detects and amplifies a signal read into the local data lines LDQ<3:0> and supplies the write data inputted from the data input/output line IO<3:0> via the column switch 20 to the memory cell MC. A voltage for the column switch 20 to drive the bit line BL is applied to the local data lines LDQ<3:0>. More specifically, the voltage VRESET+N*Vα is supplied to the four local data lines LDQ<3:0> during the reset operation.

The column power line driver 23 is connected via the column power line VCo11 to the sense amplifier/write buffer 22. Also, the clamp voltage generation circuit 24 is connected via the bit line clamp voltage line BLC to the sense amplifier/write buffer 22. The column peripheral circuit 25 manages the entire variable resistive memory device to receive a control signal from the external host device, read, write, erase and execute data input/output management.

Referring to FIGS. 6 to 9, the configuration of the row control circuit will be described below in detail. FIGS. 6 to 9 are circuit diagrams showing the configuration examples of the row control circuit in the variable resistive memory device.

[Configuration of Row Decoder 10]

The row decoder 10 is connected to any one of 256 pairs of main word lines MWLx and MWLbx (x=<255:0>), the row power line VRow and the write drive line WDRV<7:0>, as shown in FIGS. 5 and 6. Also, the row decoder 10 is connected to the word line group WLx<7:0>, which is connected to a plurality of memory cells MC arranged in one row. The word line group WLx<7:0> connected to one row decoder 10 is composed of the eight wirings from the word line WLx0 to the word line WLx7, as previously described. Similarly, the write drive lines WDRV<7:0> are composed of the eight wirings from WDRV0 to WDRV7.

The row decoder 10 has eight transistor pairs of two NMOS transistors QN1 and QN2 with the sources mutually connected, as shown in FIG. 6. The main word line MWLbx is connected to the gate of the transistor QN1, and the row power line VRow is connected to the drain. Also, the main word line MWLx is connected to the gate of the transistor QN2, and any one of the write drive lines WDRV<7:0> is connected to the drain. And both the sources of the transistors QN1 and QN2 are connected to any one line of the word line group WLx<7:0>.

[Configuration of Main Row Decoder 11]

The main row decoder 11 is connected to 256 pairs of main word lines MWLx and MWLbx (x=<255:0>), and the address signal line, as shown in FIGS. 5 and 7. The word lines WL of the variable resistive memory device according to this embodiment have a hierarchical structure.

The main row decoder 11 is a predecoder. One set of main word lines MWLx and MWLbx are connected to eight transistor pairs (QN1, QN2 in FIG. 6) within the row decoder 10, and one row decoder 10 can select any one of the eight word lines WLx<7:0>. The main row decoder 11 has a circuit of FIG. 7 for each pair of main word lines MWLx and MWLbx.

The address signal line connected to the main row decoder 11 is connected to a logical gate GATE1 in one main row decoder 11, as shown in FIG. 7. An output signal of the logical gate GATE1 is supplied via a level shifter L/S to the input terminal of a CMOS inverter CMOS1 composed of the PMOS transistor QP1 and the NMOS transistor QN3. The power source VSETH is connected to the source of the transistor QP1, and the source of the transistor QN3 is grounded. And both drains of the transistors QP1 and QN3 are connected to the main word line MWLx.

Also, the main word line MWLx is connected to a CMOS inverter CMOS2 composed of the PMOS transistor QP2 and the NMOS transistor QN4. The power source VSETH is connected to the source of the transistor QP2, and the source of the transistor QN4 is grounded. And both drains of the transistors QP2 and QN4 are connected to the main word line MWLbx.

[Configuration of Write Drive Line Driver 12]

The write drive line driver 12 is connected to the row power line VRow and the address signal line, as shown in FIGS. 5 and 8. Herein, the write drive line driver 12 is also a predecoder.

The address signal line connected to the write drive line driver 12 is connected to a logical gate GATE2. An output signal of the logical gate GATE2 is supplied via the level shifter L/S to the input terminal of a CMOS inverter CMOS3 composed of the PMOS transistor QP3 and the NMOS transistor QN5. The row power line VRow to which the voltage VRESET is applied is connected to the source of the transistor QP3, and the source of the transistor QN5 is grounded. And both the drains of the transistors QP3 and QN5 are connected to the write drive line WDRV<7:0>.

[Configuration of Row Power Line Driver 13]

The row power line driver 13 is connected to the row power line VRow and the control signal line, as shown in FIGS. 5 and 9. In the row power line driver 13, the power source VSETH is connected to the drain and gate of the NMOS transistor QN6. The source of the transistor QN6 is connected via the PMOS transistor QP6 to the row power line VRow. A control signal SETon is supplied to the gate of the transistor QP6.

Also, in the row power line driver 13, the power source VREAD is connected via the PMOS transistor QP4 to the row power line VRow, and the power source VRESET is connected via the PMOS transistor QP5 to the row power line VRow. A control signal READon is supplied to the gate of the transistor QP4, and a control signal RESETon is supplied to the gate of the transistor QP5. The control signals READon and RESETon are turned from the "H" state to the "L" state during the data read operation and the reset operation.

Referring now to FIGS. 10 to 14, the configuration of the column control circuit will be described below in detail. FIGS. 10 to 14 are circuit diagrams showing the configuration examples of the column control circuit in the variable resistive memory device.

[Configuration of Column Switch 20]

The column switch 20 is connected to any one of 128 pairs of column selection lines CSLy and CSLby (y=<127:0>) and the local data line LDQ<3:0>, as shown in FIGS. 5 and 10. Also, the column switch 20 is connected to the bit line group BLy<3:0>, which is connected to a plurality of memory cells MC arranged in one column. The bit line group BLy<3:0> connected to one column switch 20 is composed of four wirings from the bit line BLy0 to the bit line BLy3, as previously described. Similarly, the local data line LDQ<3:0> is composed of four wirings from LDQ0 to LDQ3.

The column switch 20 has four transistor pairs of two NMOS transistors QN11 and QN12 with the sources mutually connected, as shown in FIG. 10. The column selection line CSLy is connected to the gate of the transistor QN11, and any one line of the local data lines LDQ<3:0> is connected to the drain. Also, the column selection line CSLby is connected to the gate of the transistor QN12, and the drain is grounded. And both the sources of the transistors QN11 and QN12 are connected to any one line of the bit line group BLy<3:0>.

[Configuration of Column Decoder 21]

The column decoder 21 is connected to 128 pairs of column selection lines CSLy and CSLby (y=<127:0>) and the address signal line, as shown in FIGS. 5 and 11. In the variable resistive memory device according to this embodiment, one set of column selection lines CSLy and CSLby is connected to four transistor pairs (QN11, QN12 in FIG. 10) within one column switch 20, which can select any one line of the four bit line group BLy<3:0>. The column decoder 21 has a circuit of FIG. 11 for each pair of the column selection lines CSLy and CSLby.

The address signal line connected to the column decoder 21 is connected to a logical gate GATE3 in one column decoder 21, as shown in FIG. 11. An output signal of the logical gate GATE3 is supplied via the level shifter L/S to the input terminal of a CMOS inverter CMOS11 composed of the PMOS transistor QP11 and the NMOS transistor QN13. The power source VSETH is connected to the source of the transistor QP11, and the source of the transistor QN13 is grounded. And both the drains of the transistors QP11 and QN13 are connected to the column selection line CSLy.

Also, the column selection line CSLy is connected to a CMOS inverter CMOS12 composed of the PMOS transistor QP12 and the NMOS transistor QN14. The power source VSETH is also connected to the source of the transistor QP12, and the source of the transistor QN14 is grounded. And both the drains of the transistors QP12 and QN14 are connected to the column selection line CSLby.

[Configuration of Sense Amplifier/Write Buffer 22]

The sense amplifier/write buffer 22 is connected to the column power line VCol1, the local data lines LDQ<3:0> and the data input/output lines IO<3:0>, as shown in FIGS. 5 and 12. First of all, the configuration of a write buffer part will be described below. The data input/output line IO<3:0> connected to the sense amplifier/write buffer 22 is connected via the level shifter L/S to a CMOS inverter CMOS13 composed of the PMOS transistor QP13 and the NMOS transistor QN15. The column power line VCol1 is connected to the source of the transistor QP13. A reset voltage VRESET is applied to the column voltage line VCol1, as will be described later. Also, the source of the transistor QN15 is grounded.

And both the drains of the transistors QP13 and QN15 are connected via a switch SW1 to the drain of an NMOS transistor (clamp transistor) QN17. Also, the source of the transistor QN17 is connected to the local data lines LDQ<3:0>. The transistor QN17 can transfer the reset voltage VRESET+N*Vα to the local data line LDQ<3:0> if a voltage is applied from the bit line clamp voltage line BLC to the gate.

Next, the configuration of a sense amplifier part will be described below. The data input/output line IO<3:0> connected to the sense amplifier/write buffer 22 is connected to a sense amplifier S/A. The sense amplifier S/A may be of various types, such as a single end type and a differential type using a reference cell. The output terminal of the sense amplifier S/A is connected via a switch SW2 to the local data line LDQ<3:0>.

[Configuration of Column Power Line Driver 23]

The column power line driver 23 is connected to the column power line VCol1 and the control signal line, as shown in FIGS. 5 and 13. In the column power line driver 23, the power source VSETH is connected to the drain and gate of the NMOS transistor QN16, and the source of the transistor QN16 is connected via the PMOS transistor QP14 to the column power line VCol1. A control signal SETon is supplied to the gate of the transistor QP14.

Also, in the column power line driver 23, the power source VRESET is connected via the PMOS transistor QP15 to the column power line VCol1. A control signal RESETon is supplied to the gate of the transistor QP15. The control signal RESETon is turned from the "H" state to the "L" state during the reset operation.

[Configuration of Clamp Voltage Generation Circuit 24]

Figure 14:
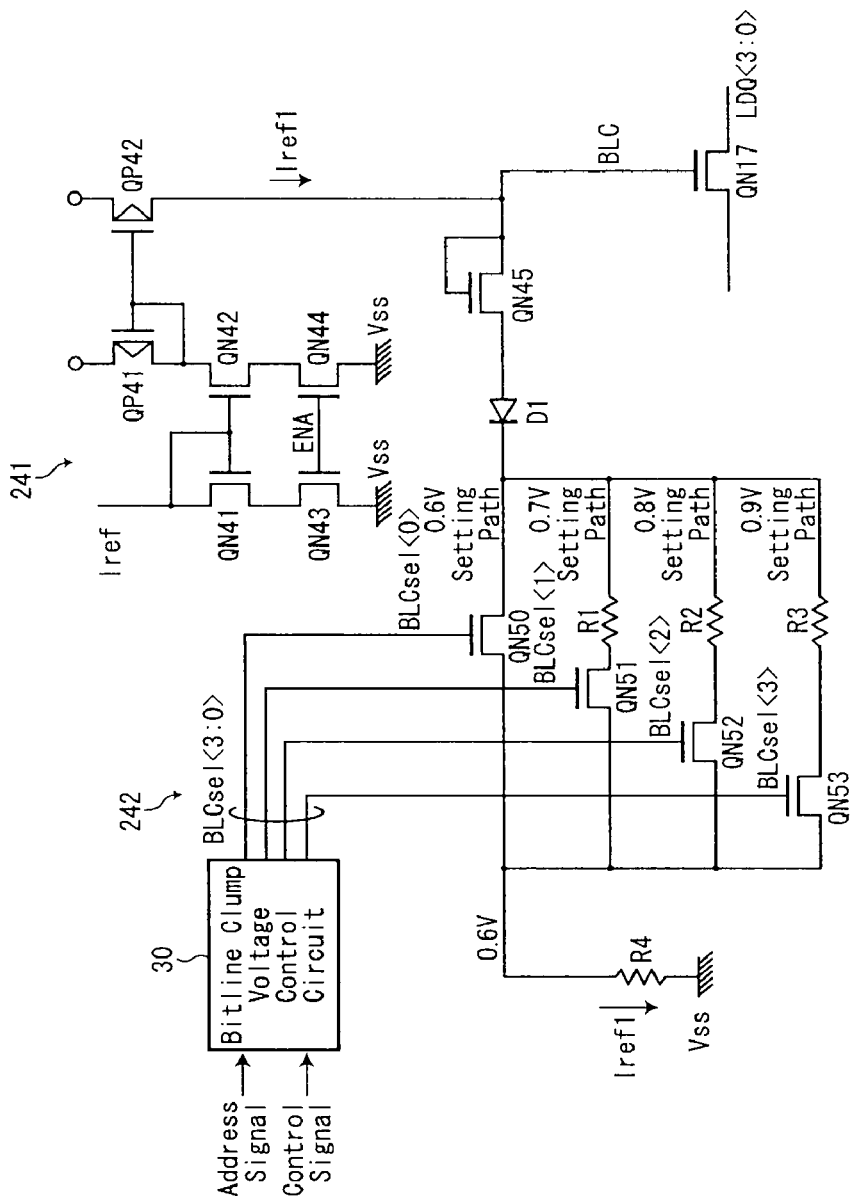
FIG. 14 is a circuit diagram showing an arrangement example of a column control circuit for the variable resistive memory device according to the first embodiment.

The clamp voltage generation circuit 24 is connected to the control signal line, the address signal line and the bit line clamp voltage line BLC, as shown in FIGS. 5 and 14. This clamp voltage generation circuit 24 includes a constant current circuit 241 for outputting a constant current Iref1, and an NMOS transistor QN45, a diode DI and a variable resistance circuit 242 that are connected in series to the current path through which the constant current Iref1 outputted from this constant current circuit 241 flows.

The constant current circuit 241 has the NMOS transistors QN41 and QN42 composing a current mirror pair, and the NMOS transistors QN43 and QN44 for circuit activation connected in series to the transistors QN41 and QN42. Also, the constant current circuit 241 has the PMOS transistors QP41 and QP42 composing a current mirror output circuit for receiving an output of the current mirror pair and outputting the constant current Iref1.

The transistor QN45 serves a function of tracking the threshold value of the transistor QN17 in the write buffer 22, and is formed to achieve the same characteristics as the transistor QN17. The voltage of the bit line BL during the reset operation is decreased by the threshold value of the transistor QN17 in the write buffer 22. Therefore, it has a structure for decreasing the same threshold value by diode connecting the transistor QN45.

The diode D1 serves to track the voltage drop of the diode Di for the memory cell MC, and is created under the same conditions as the diode Di for the memory cell MC and formed to have the same characteristics.

The variable resistance circuit 242 has a parallel circuit in which a first path composed of the transistor QN50, a second path composed of the transistor QN51 and the resistor R1, a third path composed of the transistor QN52 and the resistor R2, and a fourth path composed of the transistor QN53 and the resistor R3 are connected in parallel. The variable resistance circuit 242 is composed of this parallel circuit and the resistor R4 connected in series In this embodiment, the resistance values of the resistors R1, R2, R3 and R4 are R, 2R, 3R and 3R. Also, the current value of the constant current Iref1 satisfies 3R*Iref1=0.6V. The first path to fourth path are selected by selectively turning on the transistors QN50 to QN53. The bit line clamp voltage selection lines BLCsel <0> to <3> are connected to the gates of the transistors QN50 to QN53. The bit line clamp voltage selection lines BLCsel <0> to <3> are selectively driven by a bit line clamp voltage control circuit 30. Herein, the address signal and the control signal inputted into the bit line clamp voltage control circuit 30 contains information on the location of the memory cell MC for which the reset operation is performed within the memory cell array MA and the number of cells for which the reset operation is performed at the same time. The bit line clamp voltage control circuit 30 controls which of the bit line clamp voltage selection lines BLCsel <0> to <3> is selectively driven based on these information.

The reset operation of the variable resistive memory device configured in the above way will be described below. First of all, the operation of the row control circuit in the variable resistive memory device during the reset operation will be described below with reference to FIGS. 5 to 9. The word lines WL have a hierarchical structure as shown in FIG. 5. The voltage applied to the write drive line WDRV<7:0> or the row power line VRow is applied to the word line group WLx<7:0> selectively driven by the main row decoder 11 and the row decoder 10. First of all, the operation of applying the voltage to the write drive line WDRV<7:0> and the row power line VRow connected to the row decoder 10 will be described below.

[Operation of Row Power Line Driver 13]

During the reset operation, the control signal (RESETon signal) supplied to the gate of the transistor QP5 in the row power line driver 13 is put in the "L" state to make electrical continuity. The row power line driver 13 drives the row power line VRow to the voltage VRESET during the reset operation.

[Operation of Write Drive Line Driver 12]

The address signal is inputted into the logical gate GATE2 of the write drive line driver 12. Based on this address signal, the logical gate GATE2 supplies the "H" signal for one write drive line (e.g., WDRV1) corresponding to the address signal and the "L" signal for the other write drive lines not corresponding to it to the input terminal of the CMOS inverter CMOS3. In the case of the write drive line (e.g., WDRV1) corresponding to the address signal, the "H" signal is supplied to the input terminal of the CMOS inverter CMOS3, so that the ground voltage Vss (e.g., 0V) is applied via the conducting transistor QN5 to the write drive line WDRV1. In the case of the write drive line not corresponding to the address signal, the "L" signal is supplied to the input terminal of the CMOS inverter CMOS3, so that the voltage (VRESET) of the row power line VRow is applied via the conducting transistor QP3 to the write drive lines WDRV.

A selective drive operation of the main word lines MWLx, MWLbx and the word lines WLx<7:0> with the main row decoder 11 and the row decoder 10 will be described below.

[Operation of Main Row Decoder 11]

The address signal is also supplied to the input terminal of the logical gate GATE1 in the main row decoder 11. Based on this address signal, the logical gate GATE1 supplies the "L" signal for the selected x (e.g., x=0) of x=<255:0> and the "H" signal for the unselected x to the input terminal of the CMOS inverter CMOS1. Firstly, the selected x (e.g., x=0) will be described below. In the case of the selected x (e.g., x=0), the "L" signal is supplied to the input terminal of the CMOS inverter CMOS1, so that the "H" signal of the power source VSETH is supplied via the conducting transistor QP1 to the main word line MWL0. Also, the "H" signal of the main word line MWL0 is supplied to the input terminal of the CMOS inverter CMOS2, so that the "L" signal of the ground voltage Vss is supplied via the conducting transistor QN4 to the main word line MWLb0. That is, in the case of the selected x (e.g., x=0), the "H" signal is supplied to the main word line MWL0 and the "L" signal is supplied to the main word line MWLb0.

Next, the unselected x will be described below. In the case of the unselected x, the "H" signal is supplied to the input terminal of the CMOS inverter CMOS1, so that the "L" signal of the ground voltage Vss is supplied via the conducting transistor QN3 to the main word line MWLx. Also, the "L" signal of the main word line MWLx is supplied to the input terminal of the CMOS inverter CMOS2, so that the "H" signal of the power source VSETH is supplied via the conducting transistor QP2 to the main word line MWLbx. That is, in the case of the unselected x, the "L" signal is supplied to the main word line MWLx and the "H" signal is supplied to the main word line MWLbx.

[Operation of Row Decoder 10]

The row decoder 10 applies the voltage of the row power line VRow or write drive line WDRV to the word line WL, based on a signal supplied to the main word lines MWLx and MWLbx. In the case of the selected x (e.g., x=0), the "H" signal is supplied to the main word line MWL0, and the "L" signal is supplied to the main word line MWLb0. Since the "L" signal is supplied to the gate of the transistor QN1 and the "H" signal is supplied to the gate of the transistor QN2 in the row decoder 10, the voltage of the write drive line WDRV<7:0> is applied via the conducting transistor QN2 to the word line group WL0<7:0>. Herein, the ground voltage (e.g., 0V) is applied to the write drive line (e.g., WDRV1) corresponding to the address signal, and the voltage (e.g., VRESET) of the row power line VRow is applied to the other write drive lines not corresponding to the address signal. The ground voltage (e.g., 0V) is applied to only one word line WL01 corresponding to the address signal in the word line group WL0<7:0>, and the voltage VRESET is applied to the other word lines WL.

Also, in the case of the unselected x, the "L" signal is supplied to the main word line MWLx, and the "H" signal is supplied to the main word line MWLbx. Since the "H" signal is supplied to the gate of the transistor QN and the "L" signal is supplied to the gate of the transistor QN2 in the row decoder 10, the voltage (VRESET) of the row power line VRow is applied via the conducting transistor QN1 to the word line group WLx<7:0>. Thereby, the ground voltage (e.g., 0V) is applied to only one word line WL01 selected by the address signal and the voltage (VRESET) of the row power line VRow is applied to all the other word lines WL during the set operation.

Referring to FIG. 5 and FIGS. 10 to 14, the operation of the column control circuit in the variable resistive memory device during the set operation will be described below. The voltage applied to the local data line LDQ<3:0> is applied to the bit line group BLy<3:0> selectively driven by the column decoder 21 and the column switch 20. Also, the voltages of the column power line VCol1 and the bit line clamp voltage line BLC are applied via the sense amplifier/write buffer 22 to the local data line LDQ<3:0>. First of all, the operation of applying the voltage to the local data line LDQ<3:0>, the column power line VCol1 and the bit line clamp voltage line BLC will be described below.

[Operation of Clamp Voltage Generation Circuit 24]

The bit line clamp voltage control circuit 30 selectively turns on the transistors QN50 to QN53, based on the address signal and the control signal. Thereby, the reset voltage VRESET+N*Vα applied to the bit line clamp voltage line BLC is set. In this embodiment, the resistance values of the resistors R1, R2, R3 and R4 are R, 2R, 3R and 3R, and 3R*Iref1=0.6V. Therefore, the potential of the diode D1 on the anode side can be set to 0.6V, 0.7V, 0.8V and 0.9V by turning on the bit line clamp voltage selection lines BLCsel<0>, BLCsel<1>, BLCsel<2>, and BLCsel<3>. This voltage of the diode D1 on the anode side is applied to the bit line clamp voltage line BLC.

In this way, the clamp voltage generation circuit 24 according to this embodiment can change the voltage applied to the bit line clamp voltage line BLC. By adjusting the resistance values of the resistors R1 to R3, the voltage VRESET+N*Vα+Vt applied to the bit line clamp voltage line BLC can be generated. Herein, the voltage Vt is the threshold voltage of the transistor QN17.

[Operation of Column Power Line Driver 23]

During the reset operation, the control signal (RESETon signal) supplied to the gate of the transistor QP15 in the column power line driver 23 is put in the "L" state to make electrical continuity. The column power line driver 23 drives the column power line VCol1 to the voltage VRESET during the reset operation.

[Operation of Sense Amplifier/Write Buffer 22]

In the sense amplifier/write buffer 22, the switch SW1 of the write buffer part is turned on so that the write buffer part is put in a conductive state, and the switch SW2 of the sense amplification part is turned off so that the sense amplification part is put in a non-conductive state during the set operation. Write data is supplied via the data input/output line IO<3:0> to the sense amplifier/write buffer 22. This write data is supplied via the level shifter L/S to the input terminal of the CMOS inverter CMOS13. In accordance with this data, the voltage VRESET of the column power line VCol1 is applied from the output terminal of the CMOS inverter CMOS13 via the switch SW1 to the drain of the transistor QN17. Also, the reset voltage VRESET+N*Vα+Vt generated by the clamp voltage generation circuit 24 is applied via the bit line clamp voltage line BLC to the gate of the transistor QN17. With this reset voltage VRESET+N*Vα+Vt, the transistor QN17 of the threshold voltage Vt is turned on, so that the reset voltage VRESET+N*Vα is transferred to the local data line LDQ<3:0>.

Next, a selective drive operation for the column selection lines CSLy, CSLby and the bit line group BLy<3:0> with the column decoder 21 and the column switch 20 will be described below.

[Operation of Column Decoder 21]

The address signal is supplied to the input terminal of the logical gate GATE3 in the column decoder 21. Based on this address signal, the logical gate GATE3 supplies the "L" signal for the selected y (e.g., y=0) of y=<127:0> and the "H" signal for the unselected y to the input terminal of the CMOS inverter CMOS11. First of all, the selected y (e.g., y=0) will be described below. In the case of the selected y (e.g., y=0), the "L" signal is supplied to the input terminal of the CMOS inverter CMOS11, so that the "H" signal of the power source VSETH is supplied via the conducting transistor QP11 to the column selection line CSL0. Also, the "H" signal of the column selection line CSL0 is supplied to the input terminal of the CMOS inverter CMOS12, so that the "L" signal of the ground voltage Vss is supplied via the conducting transistor QN14 to the column selection line CSLb0. That is, in the case of the selected y (e.g., y=0), the "H" signal is supplied to the column selection line CSL0 and the "L" signal is supplied to the column selection line CSLb0.

Next, the unselected y will be described below. In the case of the unselected y, the "H" signal is supplied to the input terminal of the CMOS inverter CMOS11, so that the "L" signal of the ground voltage Vss is supplied via the conducting transistor QN13 to the column selection line CSLy. Also, the "L" signal of the column selection line CSLy is supplied to the input terminal of the CMOS inverter CMOS12, so that the "H" signal of the power source VSETH is supplied via the conducting transistor QP12 to the column selection line CSLby. That is, in the case of the unselected y, the "L" signal is supplied to the column selection line CSLy and the "H" signal is supplied to the column selection line CSLby.

[Operation of Column Switch 20]

The column switch 20 applies the voltage of the local data line LDQ<3:0> to the bit lines BL, based on the signals supplied to the column selection lines CSLy and CSLby. In the case of the selected y (e.g., y=0), the "H" signal is supplied to the column selection line CSL0, and the "L" signal is supplied to the column selection line CSLby. The "H" signal is supplied to the gate of the transistor QN11, and the "L" signal is supplied to the gate of the transistor QN12 in the column switch 20. Therefore, the reset voltage (VRESET+

N*Vα) of the local data line LDQ<3:0> is applied via the conducting transistor QN12 to the selected bit line group BL0<3:0>.

On the other hand, in the case of the unselected y, the "L" signal is supplied to the column selection line CSLy, and the "H" signal is supplied to the column selection line CSLby. The "L" signal is supplied to the gate of the transistor QN11 in the column switch 20, and the "H" signal is supplied to the gate of the transistor QN12. Therefore, the ground voltage Vss=0V is applied via the conducting transistor QN12 to the bit line group BLy<3:0>. Thereby, during the reset operation, the voltage VRESET+N*Vα is applied to the bit line BL0<3:0> selected by the address signal and the ground voltage (0V) is applied to all the other lines of the bit line group BLy<3:0>.

In this way, with the column control circuit of this embodiment, the voltage N*Vα of the voltage drop due to the parasitic resistance of the wiring in addition to the voltage VRESET can be applied to the selected bit lines BL00 to BL03 connected to the selection memory cells MC10 to MC13 during the reset operation. This voltage Vα takes a different value depending on the position of the memory cell MC within the memory cell array MA. Also, N is the number of selected memory cells MC for which the reset operation is performed.

In this embodiment, the reset voltage applied to each bit line BL is changed based on the address of the memory cell MC and the number of cells for which the reset operation is performed. More specifically, in the clamp voltage generation circuit, the value of the reset voltage to be generated can be changed by connecting the constant current circuit and the variable resistive circuit in series. Also, the changed reset voltage can be set based on the address of the memory cell MC designated by the address signal and the number of memory cells for which the reset operation is performed, designated by the control signal.

In this way, after the voltage drop due to the wiring resistance of the bit line BL and the word line WL, the voltage applied to the memory cell MC for which the reset operation is performed becomes the constant reset voltage VRESET in this embodiment. Therefore, even if the voltage drop due to the wiring resistance occurs, the reset voltage VRESET sufficient to perform the reset operation for the memory cell MC is applied. The variable resistive memory device according to this embodiment can securely perform the reset operation for a number of memory cells.

Second Embodiment

Figure 15:
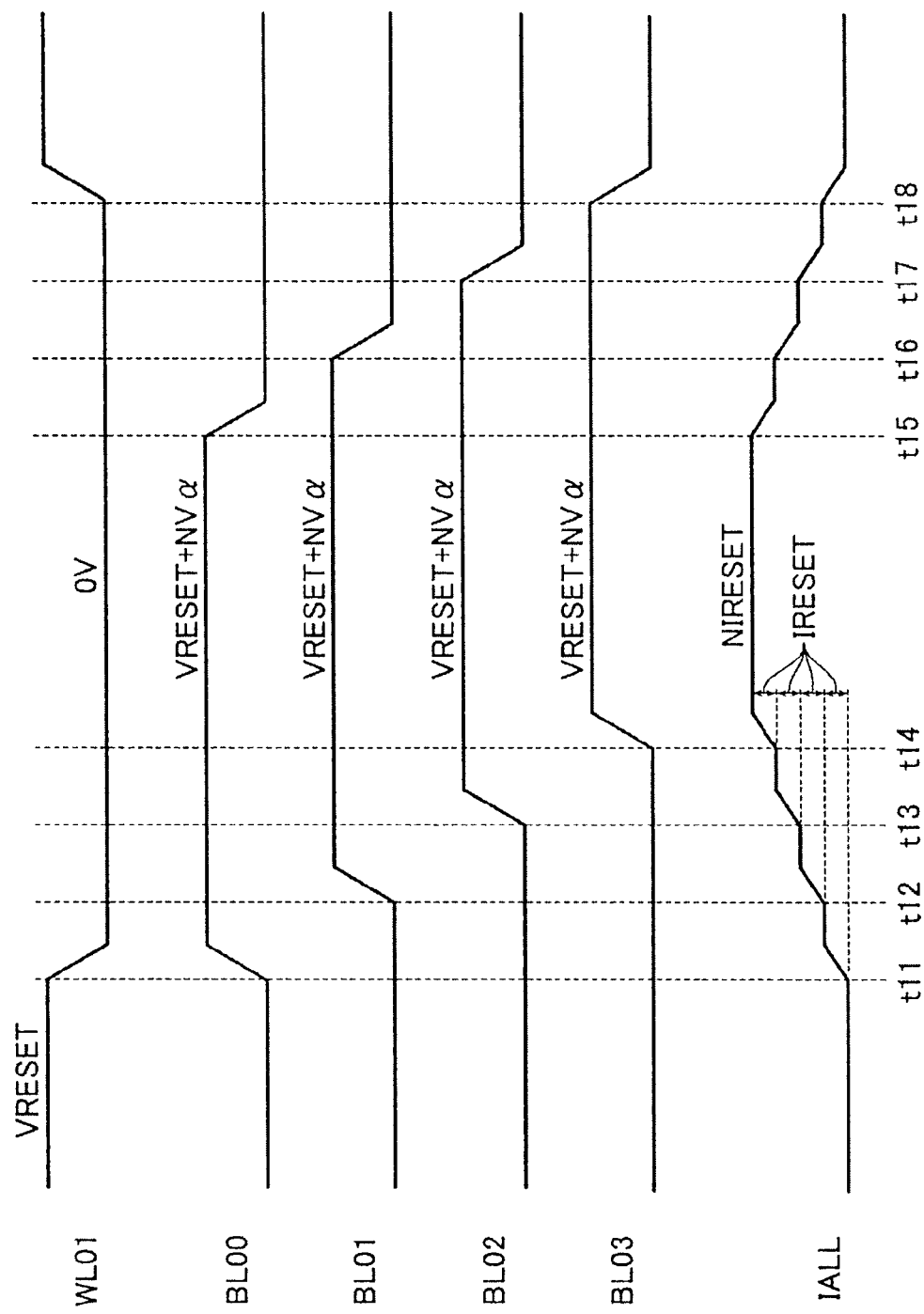
FIG. 15 is a view showing the change of voltage and current applied to the bit lines and the word line of the variable resistive memory device according to a second embodiment.

Referring to FIG. 15, a second embodiment of the variable resistive memory device according to the invention will be described below. FIG. 15 is a view showing the temporal changes in the voltage and current applied to the bit lines BL and the word lines WL connected to the memory cell array MA during the reset operation of the memory cell MC. The configuration of the control circuit for the variable resistive memory device according to the second embodiment is the same as that of the variable resistive memory device according to the first embodiment. In the variable resistive memory device according to the second embodiment, the same reference signs are attached to the components having the same configuration as in the first embodiment, the explanation of which is omitted. The variable resistive memory device according to this embodiment is different from the first embodiment in that the timing of applying the voltage to each bit line BL is deviated in performing the reset operation.

In performing the reset operation for the selected memory cell CM as shown in FIG. 15, first of all, the voltage applied to the selected word line WL01 is changed from the voltage VRESET to the voltage Vss=0V (t11). At the same time, the reset voltage VRESET+N*Vα is applied to only the selected bit line BL00 connected to the selected memory cell MC10. At this time t11, the current IALL flowing though the word line WL01 is the current amount (N*IRESET) that is the reset current IRESET per memory cell MC multiplied by the number (N) of selected memory cells MC for which the reset operation is performed. Since the number of selected memory cells MC for which the reset operation is performed is one at time t11, the current IALL=IRESET.

After the potential of the bit line BL00 rises to VRESET+N*Vα, the reset voltage VRESET+N*Vα is applied to the selected bit line BL01 connected to the selected memory cell MC11 at time t12. Since the number of selected memory cells MC for which the reset operation is performed is two at the time t12, the current IALL=2*IRESET.

Similarly, the reset voltage VRESET+N*Vα is applied to the selected bit lines BL02 and BL03 connected to the selected memory cells MC12 and MC13 at the times t13 and t14. For the current IALL flowing through the word line WL01 after the reset voltage VRESET+N*Vα is applied to the bit line BL03, IALL=4*IRESET, because the number of selected memory cells MC for which the reset operation is performed is four.

Herein, to deviate the timing of applying the reset voltage VRESET+N*Vα to the bit lines BL00 to BL03, it is possible to control the control signal RESETon supplied to the transistor QP15 of the column power line driver 23 as shown in FIG. 13. Also, it may be possible to control the on/off of the switch SW1 of the sense amplifier/write buffer 22.

After the passage of the time required for the reset operation of the memory cell MC, the voltage applied to the selected bit line BL00 is changed to voltage Vss=0V at time t15. Similarly, after the passage of the time of the reset operation of each memory cell MC11, MC12, MC13, the voltage applied to the selected bit line BL01, BL02, BL03 is changed to voltage Vss=0V at time t16, t17, t18. And the reset operation of the memory cell MC is ended by applying the voltage VRESET to the word line WL01 at time t18.

With this reset operation, the diodes Di of the selected memory cells MC10 to MC13 take the forward bias state to make a current flow. Herein, the voltage N*Vα among the reset voltage VRESET+N*Vα applied to the bit lines BL00 to BL03 is the voltage corresponding to the voltage drop due to the parasitive resistances PRb and PRw of the wirings in the bit line BL and the word line WL. Because of the voltage drop of the voltage N*Vα due to the parasitic resistances of the wirings, the potential difference VRESET is applied to the selected memory cells MC10 to MC13. Owing to this potential difference VRESET, the variable resistive element VR changes from the high-resistance state to the low-resistance state.

In this embodiment, the voltage N*Vα of the voltage drop due to the parasitic resistances of the wirings in addition to the voltage VRESET capable of performing the reset operation for the memory cell MC is applied to the selected bit lines BL00 to BL03 connected to the selected memory cells MC10 to MC13. This voltage Vα takes a different value depending on the position of the memory cell MC within the memory cell array MA. Also, N is the number of selected memory cells MC for which the reset operation is performed. The reset voltage applied to each bit line BL is changed depending on the address of the memory cell MC and the number of cells for which the reset operation is performed. After the voltage drop due to the wiring resistances of the bit line BL and the word line WL, the voltage applied to the memory cell MC for which the reset voltage is performed is the constant reset voltage VRESET. Therefore, even if there is the voltage drop due to the wiring resistance, the voltage VRESET sufficient to perform the reset operation for the memory cell MC is applied. The variable resistive memory device according to this embodiment can securely perform the reset operation for a number of memory cells.

Also, in this embodiment, the reset operation is performed by deviating the timing of applying the reset voltage to the selected bit lines BL00 to BL03. If the reset operation for a plurality of memory cells MC is performed at the same time as shown in FIG. 4, the plurality of memory cells may be changed from the low-resistance state to the high-resistance state. In such a case, the current flowing through the memory cell array MA rapidly fluctuates, with a risk that the power source overshoots. And the power source voltage temporarily rises from the reset voltage VRESET to around the set voltage VSET, resulting in a problem that the set operation is falsely performed for the memory cell MC for which the reset operation is performed.

The variable resistive memory device according to this embodiment performs the reset operation by deviating the timing of applying the reset voltage to the selected bit lines BL00 to BL03. Therefore, the plurality of memory cells MC are not changed from the low-resistance state to the high-resistance state at the same time, so that the false set operation does not occur. The variable resistive memory device according to this embodiment can securely perform the reset operation for a number of memory cells.

Third Embodiment

Figure 16:
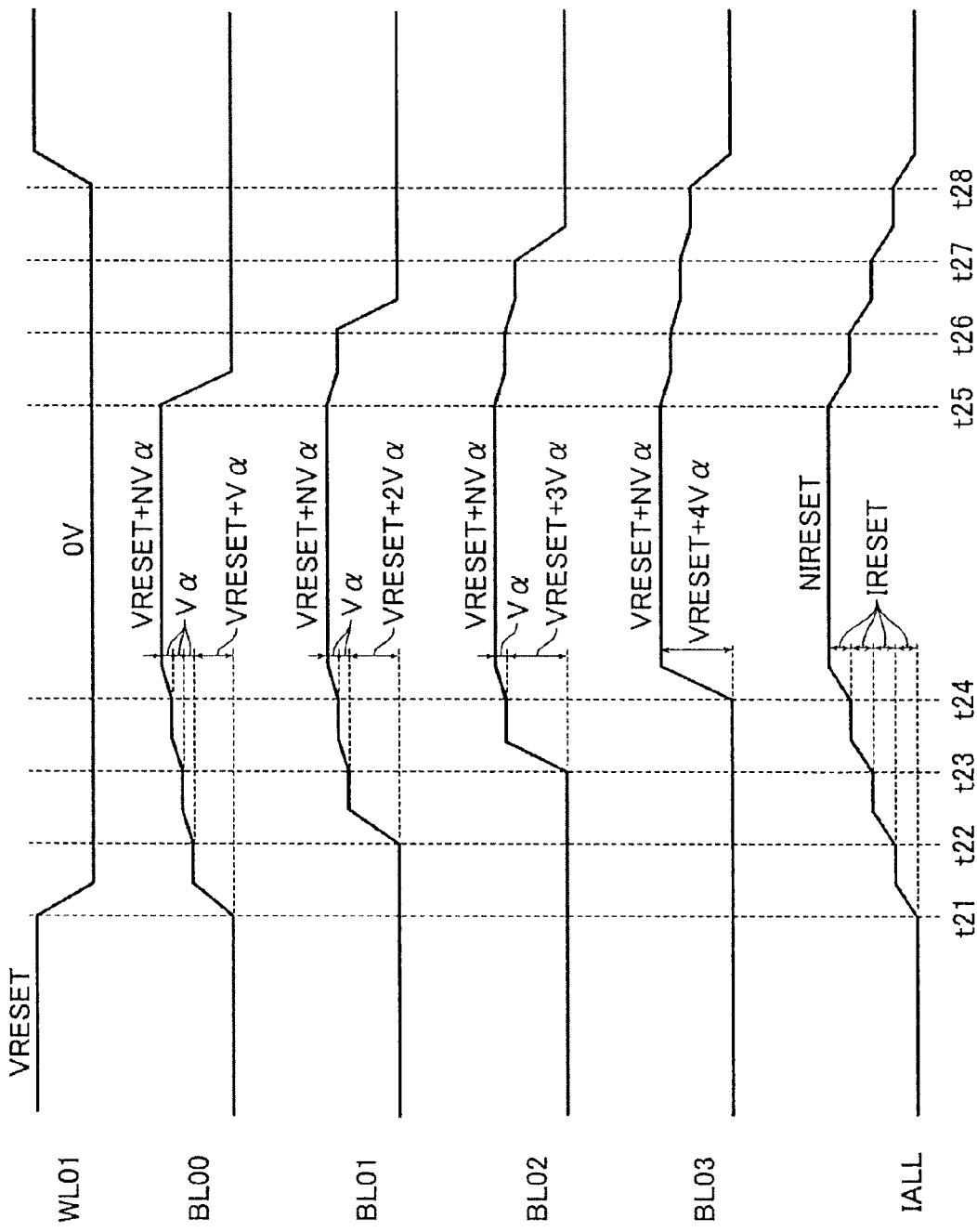
FIG. 16 is a view showing the change of voltage and current applied to the bit lines and the word line of the variable resistive memory device according to a second embodiment.

Referring to FIG. 16, a third embodiment of the variable resistive memory device according to the invention will be described below. FIG. 16 is a view showing the temporal changes in the voltage and current applied to the bit lines BL and the word line WL connected to the memory cell array MA during the reset operation of the memory cell MC. Herein, the configuration of the control circuit for the variable resistive memory device according to the third embodiment is the same as that of the variable resistive memory device according to the first embodiment. In the variable resistive memory device according to the third embodiment, the same reference signs are attached to the components having the same configuration as in the first embodiment, the explanation of which is omitted. The variable resistive memory device according to this embodiment is different from the first embodiment in that the timing of applying the voltage to each bit line BL is deviated in performing the reset operation. Also, it is different from the first and second embodiments in that the voltage applied to each bit line BL is changed stepwise in performing the reset operation.

In performing the reset operation for the selected memory cell CM as shown in FIG. 16, first of all, the voltage applied to the selected word line WL01 is changed from the voltage VRESET to the voltage Vss=0V (time t21). At the same time, the reset voltage VRESET+Vα is applied to only the selected bit line BL00 connected to the selected memory cell MC10. At this time t21, the current IALL flowing though the word line WL01 is the current amount (N*IRESET) that is the reset current IRESET per memory cell MC multiplied by the number (N) of selected memory cells MC for which the reset operation is performed. For the current IALL flowing through the word line WL01, IALL=IRESET, because the number of selected memory cells MC for which the reset operation is performed is one at time t21.

After the potential of the bit line BL00 rises to VRESET+Vα, the reset voltage VRESET+2*Vα is applied to the selected bit line BL01 connected to the selected memory cell MC11 at time t22. At the same time, the reset voltage VRESET+Vα applied to the selected bit line BL00 is raised to the reset voltage VRESET+2*Vα. Since the number of selected memory cells MC for which the reset operation is performed is two at this time t22, the current IALL=2*IRESET.

Next, the reset voltage VRESET+3*Vα is applied to the selected bit line BL02 connected to the selected memory cell MC12 at time t23. At the same time, the reset voltage VRESET+2*Vα applied to the selected bit lines BL00, BL01 is raised to the reset voltage VRESET+3*Vα. Since the number of selected memory cells MC for which the reset operation is performed is three at this time t23, the current IALL=3*IRESET.

Next, the reset voltage VRESET+4*Vα is applied to the selected bit line BL03 connected to the selected memory cell MC13 at time t24. At the same time, the reset voltage VRESET+3*Vα applied to the selected bit lines BL00, BL01, BL02 is raised to the reset voltage VRESET+4*Vα. Since the number of selected memory cells MC for which the reset operation is performed is four at this time t24, the current IALL=4*IRESET.

Herein, to deviate the timing of applying the reset voltage VRESET+N*Vα to the bit lines BL00 to BL03, it is possible to control the control signal RESETon supplied to the transistor QP15 of the column power line driver 23 as shown in FIG. 13. Also, it may be possible to control the on/off of the switch SW1 of the sense amplifier/write buffer 22.

Also, to raise the reset voltage applied to the bit line BL stepwise, it is necessary to raise the clamp voltage applied to the gate of the transistor QN17 stepwise. This can be realized by selectively driving the bit line clamp voltage selection lines BLCsel<0> to <3> to raise the clamp voltage applied to the bit line clamp voltage line BLC in the clamp voltage generation circuit 24 as shown in FIG. 14. The selective driving of the bit line clamp voltage selection lines BLCsel<0> to <3> can be controlled by the bit line clamp voltage control circuit 30. By including the timing information of the reset voltage applied to the bit line in the control signal supplied to the bit line clamp voltage control circuit 30, it is possible to control the timing when the reset voltage is applied to each bit line and the raising of the reset voltage.

After the passage of the time required for the reset operation of the memory cell MC10, the voltage applied to the selected bit line BL00 is changed to voltage Vss=0V at time t25. At the same time, the reset voltage applied to the selected bit lines BL01, BL02, BL03 is lowered to the reset voltage VRESET+3*Vα. Next, the voltage applied to the selected bit line BL01 is changed to voltage Vss=0V at time t26. At the same time, the reset voltage applied to the selected bit lines BL02, BL03 is lowered to the reset voltage VRESET+2*Vα.

Similarly, the voltage applied to the selected bit line BL02 is changed to the voltage Vss=0V at time t27. At the same time, the reset voltage applied to the selected bit lines BL03 is lowered to the reset voltage VRESET+Vα. Also, the voltage applied to the selected bit line BL03 is changed to the voltage Vss=0V at time t28. And the reset operation for the memory cell MC is ended by applying the voltage VRESET to the word line WL01 at time t28.

Through this reset operation, the diodes Di of the selected memory cells MC10 to MC13 take the forward bias state to make a current flow. Herein, the voltage N*Vα among the reset voltage VRESET+N*Vα applied to the bit lines BL00 to BL03 is the voltage corresponding to the voltage drop due to the parasitive resistance PRb of the wiring in the bit line BL and the parasitive resistance PRw of the wiring in the word line WL. Because of the voltage drop of the voltage N*Vα due to the parasitic resistances of the wirings, the potential difference VRESET is applied to the selected memory cells MC10 to MC13. Owing to this potential difference VRESET, the variable resistive element VR changes from the high-resistance state to the low-resistance state.

In this embodiment, the voltage N*Vα of the voltage drop due to the parasitic resistances of the wirings in addition to the voltage VRESET capable of performing the reset operation for the memory cell MC is applied to the selected bit lines BL00 to BL03 connected to the selected memory cells MC10 to MC13. This voltage Vα takes a different value depending on the position of the memory cell MC within the memory cell array MA. Also, N is the number of selected memory cells MC for which the reset operation is performed. The reset voltage applied to each bit line BL is changed depending on the address of the memory cell MC and the number of cells for which the reset operation is performed. After the voltage drop due to the wiring resistances of the bit line BL and the word line WL, the voltage applied to the memory cell MC for which the reset voltage is performed is the constant reset voltage VRESET. Therefore, even if there is the voltage drop due to the wiring resistance, the voltage VRESET sufficient to perform the reset operation for the memory cell MC is applied. The variable resistive memory device according to this embodiment can securely perform the reset operation for a number of memory cells.

Also, in this embodiment, the reset operation is performed by deviating the timing of applying the reset voltage to the selected bit lines BL00 to BL03 and changing the reset voltage stepwise. The variable resistive memory device according to this embodiment deviates the timing of applying the reset voltage to the selected bit lines BL00 to BL03, whereby the false set operation due to overshoot of the power source does not occur. Also, in this embodiment, the same voltage and current are applied to each memory cell for which the reset operation is performed at the same time. Therefore, it is possible to suppress the discrepancy of the cell for which the reset operation is performed. The variable resistive memory device according to this embodiment can securely perform the reset operation for a number of memory cells.

Though the embodiments of the invention have been described above, the invention is not limited to those embodiments, and various changes, additions or combinations may be made without departing from the spirit or scope of the invention. For example, in the embodiment, the bit line group BLy<3:0> was composed of four wirings, and the word line group WLx<7:0> was composed of eight wirings. The number of bit lines BL included in the bit line group and the number of word lines WL included in the word line group may be changed in accordance with the design of the variable resistive memory device.

What is claimed is:

1. A semiconductor memory device comprising:
  a memory cell array in which memory cells each containing a variable resistive element and a rectifier element connected in series are arranged at intersections of a plurality of first wirings and a plurality of second wirings; and
  a control circuit for selectively driving said first wirings and said second wirings;
  wherein said control circuit applies a first voltage to a selected first wiring, and changes said first voltage based on the position of a selected memory cell within said memory cell array to apply a second voltage to a selected second wiring, so that a predetermined potential difference is applied to the selected memory cell arranged at the intersection between said selected first wiring and said selected second wiring.

2. A semiconductor memory device according to claim 1, wherein said control circuit changes said first voltage based on the number of said selected memory cells to which the predetermined potential difference is applied simultaneously within said memory cell array.

3. A semiconductor memory device according to claim 2, wherein said selected cell is reset by application of the first voltage and the second voltage.

4. A semiconductor memory device according to claim 1, wherein the change of said first voltage is the reference voltage to which a voltage drop due to said first wiring and said second wiring connected to said selected memory cell is added.

5. A semiconductor memory device according to claim 4, wherein said selected cell is reset by application of the first voltage and the second voltage.

6. A semiconductor memory device according to claim 1, wherein said control circuit changes the timing of applying the predetermined potential difference to said one selected memory cell and the timing of applying the predetermined potential difference to the other selected memory cells in applying the predetermined potential difference to a plurality of said selected memory cells.

7. A semiconductor memory device according to claim 6, wherein said selected cell is reset by application of the first voltage and the second voltage.

8. A semiconductor memory device according to claim 1, wherein said control circuit is connected to said first wiring via a clamp transistor to the gate of which a clamp voltage is supplied, said clamp transistor has a clamp voltage generation circuit for generating said clamp voltage at which said clamp transistor can transfer said first voltage to said first wiring, and said clamp voltage generation circuit changes said clamp voltage based on the position of said selected memory cell within said memory cell array and the number of said selected memory cells to which the predetermined potential difference is applied simultaneously within said memory cell array.

9. A semiconductor memory device according to claim 8, wherein said selected cell is reset by application of the first voltage and the second voltage.

10. A semiconductor memory device according to claim 1, wherein said selected cell is reset by application of the first voltage and the second voltage.

11. A semiconductor memory device according to claim 1, wherein the same voltage or current is applied to the selected first wiring and the selected second wiring simultaneously during said reset.

* * * * *